(12) United States Patent
Kubota et al.

(10) Patent No.: US 9,365,769 B2
(45) Date of Patent: *Jun. 14, 2016

(54) PHOSPHOR AND LIGHT EMITTING DEVICE

(71) Applicant: LG INNOTEK CO., LTD., Seoul (KR)

(72) Inventors: Shunichi Kubota, Seoul (KR); Satoshi Tanaka, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 18 days.

This patent is subject to a terminal disclaimer.

(21) Appl. No.: 13/921,689

(22) Filed: Jun. 19, 2013

(65) Prior Publication Data

US 2014/0021855 A1  Jan. 23, 2014

(30) Foreign Application Priority Data

Jul. 17, 2012 (KR) .................. 10-2012-0077940

(51) Int. Cl.
*C09K 11/77* (2006.01)
*H01L 33/50* (2010.01)
*C09K 11/59* (2006.01)
*C09K 11/08* (2006.01)

(52) U.S. Cl.
CPC ......... *C09K 11/7728* (2013.01); *C09K 11/0883* (2013.01); *C09K 11/59* (2013.01); *C09K 11/7734* (2013.01); *H01L 33/502* (2013.01)

(58) Field of Classification Search
None
See application file for complete search history.

(56) References Cited

U.S. PATENT DOCUMENTS

2006/0103297 A1  5/2006 Fiedler et al.
2010/0142182 A1*  6/2010 Van Woudenberg et al. ... 362/84

FOREIGN PATENT DOCUMENTS

| DE | 10 2004 051 395 A1 | 4/2006 |
| JP | 2004-189996 A | 7/2004 |
| JP | 2005-298721 A | 10/2005 |
| WO | WO 2004/030109 A1 | 4/2004 |
| WO | WO 2005/030905 A1 | 4/2005 |
| WO | WO 2005/031797 A2 | 4/2005 |
| WO | WO 2005/045881 A1 | 5/2005 |
| WO | WO 2010/041195 A1 | 4/2010 |

OTHER PUBLICATIONS

Search results performed by STIC.*
A resource from Princeton University that shows crystal geometry equations, in particular, the equation for the unit cell volume in a triclinic system.*

(Continued)

*Primary Examiner* — Anh Mai
*Assistant Examiner* — Zachary J Snyder
(74) *Attorney, Agent, or Firm* — KED & Associates, LLP

(57) ABSTRACT

A phosphor and a light emitting device including the phosphor may be provided that emits light having a peak wavelength between a green wavelength band and a yellow wavelength band, has a crystal structure of which the chemical formula is $MSi_2N_2O_2$, $M=Ca_xSr_yEu_z$ ($x+y+z=1$), and has a triclinic system crystal structure in which, when molar ratios of Ca, Sr and Eu are x, y and z respectively, $x+y+z=1$ and when the x, y and z are represented by a triangular projection, the x, y and z are distributed on the lines and at the inside of an area formed by connecting five points of (0.45, 0.55, 0), (0.75, 0.25, 0), (0.75, 0, 0.25), (0.5, 0, 0.5) and (0.45, 0.05, 0.5) by a solid line on a triangular diagram.

20 Claims, 13 Drawing Sheets

(56) References Cited

OTHER PUBLICATIONS

"Color Point Tuning for (Sr,Ca,Ba)Si2O2N2:Eu2+ for White Light LEDs" to Volker Bachmann. Published on the web on Dec. 29, 2008 by the American Chemical Society.*

"Eu2+-activated silicon-oxynitride Ca3Si2O4N2: a green-emitting phosphor for white LEDs" to Chiu et al. Published May 9, 2011.*

European Search Report dated Nov. 19, 2013 for corresponding Application No. 13176527.3.

Zhang et al, "A Tunable Green Alkaline-Earth Silicon-Oxynitride Solid Solution $(Ca_{1-x}Sr_x)Si_2O_2N_2$ $Eu^{2+}$ and its Application in LED," Applied Physics B (2008) 93: 829-835.

Yang et al, "Highly Stable Three-Band White Light From an InGaN-Based Blue Light-Emitting Diode Chip Precoated With (Oxy)Nitride Green/Red Phosphors," Applied Physics Letters 90, 123503 (2007), 3 pages.

Han et al, "Ternary Combinatorial Library of $(Sr,Ba,Ca)Si_2N_2O_2$ Phosphors in Terms of Photoluminescence and Color Chromaticity," Electrochemical and Solid-State Letters, 13 (5) (2010) J62-J64.

Zhang et al., "A Tunable Green Alkaline-Earth Silicon-Oxynitride Solid Solution $(Ca_{1-x}Sr_x)Si_2O_2N_2:Eu^{2+}$ and its Application in LED," Applied Physics B, Lasers and Optics; Oct. 11, 2008; vol. 93, No. 4; pp. 829-835.

Bachmann, Volker et al.; "Color Point Tuning for $(Sr,Ca,Ba)Si_2O_2N_2:Eu^{2+}$ for White Light LEDs"; Chemistry of Materials; published on Web Dec. 29, 2008; vol. 21; pp. 316-325.

Chinese Office Action dated Mar. 3, 2016 issued in Application No. 201310300231.X.

* cited by examiner

PHOSPHOR AND LIGHT EMITTING DEVICE

CROSS-REFERENCE TO RELATED APPLICATION

The present application claims priority under 35 U.S.C. §119(e) of Korean Patent Application No. 10-2012-0077940 filed on Jul. 17, 2012, which is hereby incorporated by reference in its entirety.

BACKGROUND

1. Field

The present invention relates to a phosphor and a light emitting device.

2. Description of Related Art

A phosphor is excited by light with a particular wavelength and emits light with a wavelength different from the particular wavelength. Such a phosphor is widely used together with a light emitting diode (LED).

Conventional phosphors have some problems. First, the conventional phosphors have weak emission intensity in a visible light region (including a blue wavelength). Secondly, a wavelength of the emitted light does not match an ideal peak wavelength. Thirdly, the emission intensity is reduced with temperature increase. For example, as a temperature rises, luminance of the phosphor is reduced (Thermal Quenching).

Meanwhile, a variety of conventional phosphors include an oxide based fluorescent material using rare earth elements. The oxide based fluorescent materials has been already widely known and some of the oxide based fluorescent materials are now being actually used. However, unlike the oxide based fluorescent material used in CCFL for PDP, CRT and LCD, an oxide based fluorescent material for LED is required to efficiently emit light by ultraviolet rays and light having a blue wavelength.

The above references are incorporated by reference herein where appropriate for appropriate teachings of additional or alternative details, features and/or technical background.

SUMMARY

One embodiment is a phosphor which emits light having a peak wavelength between a green wavelength band and a yellow wavelength band, has a crystal structure of which the chemical formula is $MSi_2N_2O_2$, $M=Ca_xSr_yEu_z$ ($x+y+z=1$), and has a triclinic system crystal structure in which, when molar ratios of Ca, Sr and Eu are x, y and z respectively, $x+y+z=1$ and when the x, y and z are represented by a triangular projection, the x, y and z are distributed on the lines and at the inside of an area formed by connecting five points of (0.45, 0.55, 0), (0.75, 0.25, 0), (0.75, 0, 0.25), (0.5, 0, 0.5) and (0.45, 0.05, 0.5) by a solid line on a triangular diagram.

Another embodiment is a phosphor which emits light having a peak wavelength between a green wavelength band and a yellow wavelength band, has a crystal structure of which the chemical formula is $MSi_2N_2O_2$, $M=Ca_xSr_yEu_z$ ($x+y+z=1$), and has a triclinic system crystal structure in which, when molar ratios of Ca, Sr and Eu are x, y and z respectively, $x+y+z=1$ and when the x, y and z are represented by a triangular projection, the x, y and z are distributed on the lines and at the inside of an area formed by connecting five points of (0.45, 0.4, 0.15), (0.75, 0.1, 0.15), (0.75, 0, 0.25), (0.6, 0, 0.4) and (0.45, 0.15, 0.4) by a solid line on a triangular diagram. A unit cell volume of the triclinic system crystal structure is greater than 700 Å$^3$.

Further another embodiment is a light emitting device including: a light emitting element; and a phosphor which is excited by a part of light emitted from the light emitting element and emits light having a wavelength different from that of the light emitted from the light emitting element. The phosphor emits light having a peak wavelength between a green wavelength band and a yellow wavelength band, has a crystal structure of which the chemical formula is $MSi_2N_2O_2$, $M=Ca_xSr_yEu_z$ ($x+y+z=1$), and has a triclinic system crystal structure in which, when molar ratios of Ca, Sr and Eu are x, y and z respectively, $x+y+z=1$ and when the x, y and z are represented by a triangular projection, the x, y and z are distributed on the lines and at the inside of an area formed by connecting five points of (0.45, 0.55, 0), (0.75, 0.25, 0), (0.75, 0, 0.25), (0.5, 0, 0.5) and (0.45, 0.05, 0.5) by a solid line on a triangular diagram.

BRIEF DESCRIPTION OF THE DRAWINGS

The embodiments will be described in detail with reference to the following drawings in which like reference numerals refer to like elements wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

<Phosphor>

Hereafter, a phosphor according to an embodiment of the present invention will be described in detail.

The phosphor according to an embodiment of the present invention is excited by ultraviolet ray and light having a peak wavelength in a blue wavelength band close to the ultraviolet ray, and then emits light having a peak wavelength between a green wavelength band and a yellow wavelength band. The phosphor according to the embodiment of the present invention is excited by light having a peak wavelength in a wavelength band of 400 nm to 480 nm, and then emits light having a peak wavelength in a wavelength band of 500 nm to 600 nm.

The phosphor according to the embodiment of the present invention has a triclinic system crystal structure containing three components of Ca, Sr and Eu.

When molar ratios of Ca, Sr and Eu included in the phosphor according to the embodiment of the present invention are x, y and z respectively, x+y+z=1. When the x, y and z are represented by a triangular projection, the x, y and z are distributed on the lines and at the inside of an area formed by connecting five points of (0.45, 0.55, 0), (0.75, 0.25, 0), (0.75, 0, 0.25), (0.5, 0, 0.5), (0.45, 0.05, 0.5) by a solid line on a triangular diagram.

Figure 3:
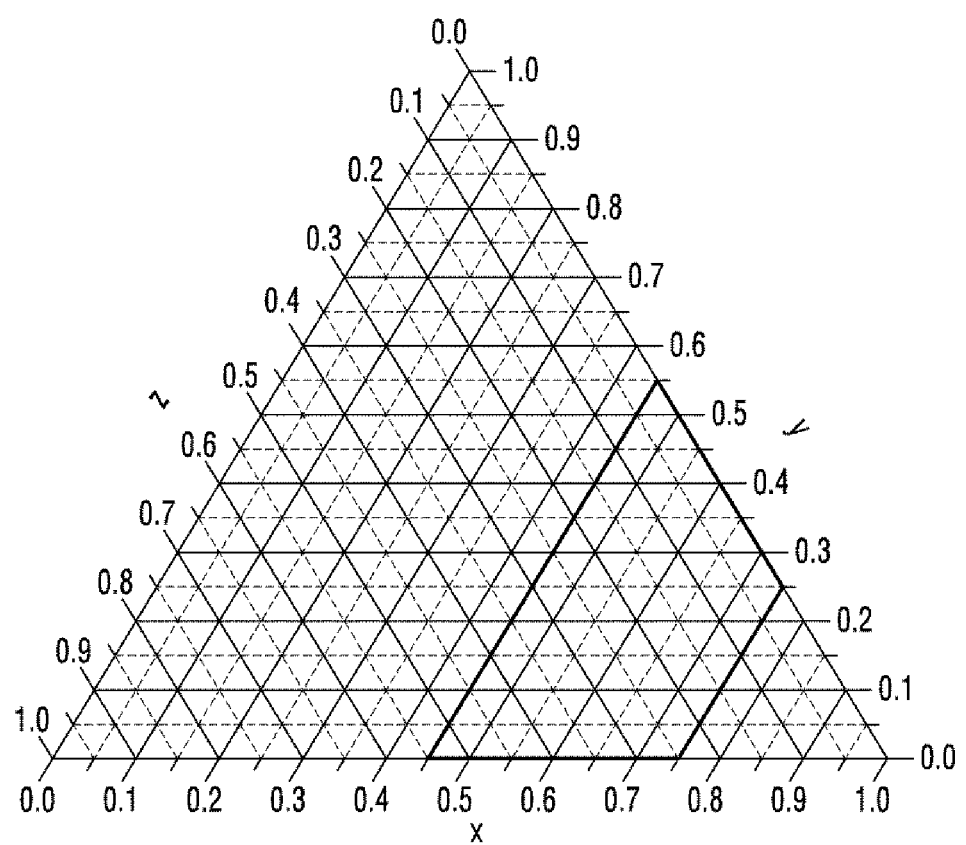
FIG. 3 is a view representing x, y and z on coordinate axes of a triangular diagram.

FIG. 3 is a view representing the x, y and z on coordinate axes of a triangular diagram. The x, y and z, i.e., molar ratios of Ca, Sr and Eu included in the phosphor according to the embodiment of the present invention are included on the lines and at the inside of the solid-line area in the triangular diagram of FIG. 3.

The phosphor according to the embodiment of the present invention may be an oxy-nitride based phosphor.

The chemical formula of the phosphor according to the embodiment may be $MSi_2N_2O_2$, $M=Ca_xSr_yEu_z$ (x+y+z=1). Here, when the molar ratios of Ca, Sr and Eu are x, y and z respectively, x+y+z=1. When the x, y and z are represented by the triangular projection, the x, y and z are distributed on the lines and at the inside of the area formed by connecting five points of (0.45, 0.55, 0), (0.75, 0.25, 0), (0.75, 0, 0.25), (0.5, 0, 0.5), (0.45, 0.05, 0.5) by a solid line on the triangular diagram. In particular, the oxy-nitride based phosphor according to the embodiment of the present invention has an excellent light emitting property under such composition. That is, the intensity and luminance of light emitted from the phosphor according to the embodiment are improved. Also, the phosphor is less affected by an ambient temperature.

The phosphor according to the embodiment of the present invention may have a crystal structure of triclinic system.

Figure 4:
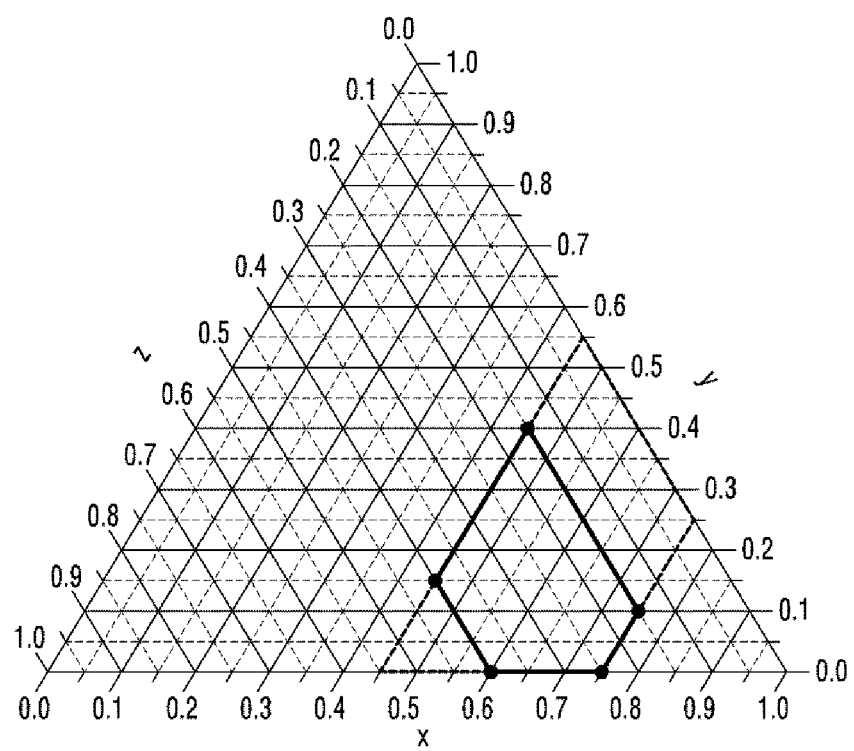
FIG. 4 is a triangular diagram representing by a solid line that light having a peak wavelength close to a yellow wavelength band is emitted.

Within the same range, particularly, when the molar ratio z of Eu is from 0.15 to 0.4, the oxy-nitride based phosphor according to the embodiment of the present invention emits light having a peak wavelength particularly close to the yellow wavelength band among the green wavelength band and the yellow wavelength band. In other words, when the molar ratio z of Eu is from 0.15 to 0.4, the aforementioned phosphor according to the embodiment of the present invention emits light having a peak wavelength particularly close to 560 nm among in the wavelength band of 500 nm to 600 nm. FIG. 4 is a view representing the x, y and z on the coordinate axes of the triangular diagram. FIG. 4 represents by a solid line the range of light having a peak wavelength close to a yellow wavelength band is emitted. In FIG. 4, the x, y and z, i.e., the molar ratios of Ca, Sr and Eu included in the phosphor according to the embodiment of the present invention are included on the lines and at the inside of the solid-line area.

When the oxy-nitride based phosphor has particularly a predetermined crystal structure that the inventor of the present invention has discovered among the crystal structures of triclinic system, it has a more excellent light emitting property. In this specification, a crystal structure having particularly excellent light emitting property among the crystal structures of triclinic system is referred to as triclinic system beta (β), and a crystal structure having no excellent light emitting property is referred to as triclinic system alpha (α). However, so long as a crystal structure having the function and effect of the present invention is included in the concept overall described in this specification, the crystal structure is not necessarily limited to a specific name.

The intensity and luminance of the light emitted from the phosphor according to the embodiment of the present invention, i.e., the phosphor having the beta (β) crystal structure of the triclinic system is improved as compared with those of the light emitted from the phosphor having no beta (β) crystal structure of the triclinic system. In addition, the phosphor having the beta (β) crystal structure of the triclinic system is less affected by an ambient temperature as compared with the phosphor having no beta (β) crystal structure of the triclinic system.

Quantum efficiency, particularly, internal quantum efficiency may be employed as one of methods for estimating the light emission efficiency of the phosphor according to the embodiment. The embodiment-based phosphor having a predetermined crystal structure, i.e., the beta (β) crystal structure of the triclinic system has more excellent internal quantum efficiency than that of the phosphor having no beta (β) crystal structure of the triclinic system.

Figure 5:
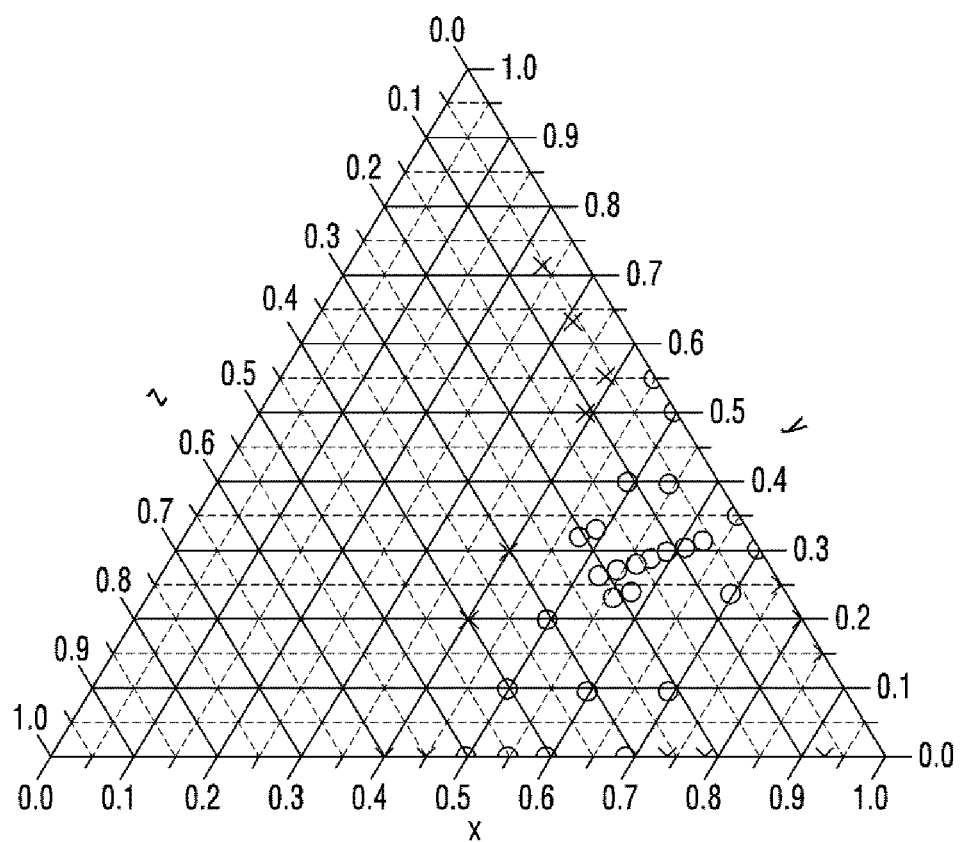
FIG. 5 is a triangular diagram representing x, y and z obtained by plotting the result shown in Table 1 on the coordinate axes of the triangular diagram.

Table 1 shows that a case where the phosphor has the triclinic system beta (β) crystal structure is represented by "○" and a case where the phosphor has the triclinic system alpha (α) crystal structure is represented by "x", through the experimental results of x, y and z, that is, the molar ratios of Ca, Sr and Eu by means of various values. FIG. 5 is a triangular diagram representing x, y and z obtained by plotting the result shown in Table 1 on the coordinate axes of the triangular diagram.

TABLE 1

| No. | x | Y | z | β phase |
|---|---|---|---|---|
| 1 | 0.4 | 0 | 0.6 | x |
| 2 | 0.45 | 0 | 0.55 | x |
| 3 | 0.5 | 0 | 0.5 | ○ |
| 4 | 0.55 | 0 | 0.45 | ○ |
| 5 | 0.6 | 0 | 0.4 | ○ |
| 6 | 0.7 | 0 | 0.3 | ○ |
| 7 | 0.75 | 0 | 0.25 | x |
| 8 | 0.8 | 0 | 0.2 | x |
| 9 | 0 | 1 | 0 | x |
| 10 | 1 | 0 | 0 | x |
| 11 | 0.95 | 0 | 0.05 | x |
| 12 | 0.7125 | 0.2375 | 0.05 | ○ |
| 13 | 0.63333 | 0.31667 | 0.05 | ○ |

TABLE 1-continued

| No. | x | Y | z | β phase |
|---|---|---|---|---|
| 14 | 0.55417 | 0.39583 | 0.05 | ○ |
| 15 | 0.475 | 0.475 | 0.05 | ○ |
| 16 | 0.39583 | 0.55417 | 0.05 | x |
| 17 | 0.31667 | 0.63333 | 0.05 | x |
| 18 | 0.2375 | 0.7125 | 0.05 | x |
| 19 | 0.6365 | 0.3135 | 0.05 | ○ |
| 20 | 0.61975 | 0.30525 | 0.075 | ○ |
| 21 | 0.603 | 0.297 | 0.1 | ○ |
| 22 | 0.58625 | 0.28875 | 0.125 | ○ |
| 23 | 0.5695 | 0.2805 | 0.15 | ○ |
| 24 | 0.55275 | 0.27225 | 0.175 | ○ |
| 25 | 0.536 | 0.264 | 0.2 | ○ |
| 26 | 0.48 | 0.32 | 0.2 | ○ |
| 27 | 0.58575 | 0.23925 | 0.175 | ○ |
| 28 | 0.568 | 0.232 | 0.2 | ○ |
| 29 | 0.495 | 0.33 | 0.175 | ○ |
| 30 | 0.55275 | 0.27225 | 0.175 | ○ |
| 31 | 0.58575 | 0.23925 | 0.175 | ○ |
| 32 | 0 | 0 | 1 | x |
| 33 | 0.5 | 0.2 | 0.3 | ○ |
| 34 | 0.5 | 0.4 | 0.1 | ○ |
| 35 | 0.6 | 0.1 | 0.3 | ○ |
| 36 | 0.7 | 0.1 | 0.2 | ○ |
| 37 | 0.5 | 0.1 | 0.4 | ○ |
| 38 | 0.6 | 0.3 | 0.1 | ○ |
| 39 | 0.45 | 0.55 | 0 | ○ |
| 40 | 0.7 | 0.3 | 0 | ○ |
| 41 | 0.4 | 0.3 | 0.3 | x |
| 42 | 0.4 | 0.2 | 0.4 | x |
| 43 | 0.4 | 0.5 | 0.1 | x |
| 44 | 0.4 | 0.6 | 0 | x |
| 45 | 0.5 | 0.5 | 0 | ○ |
| 46 | 0.65 | 0.35 | 0 | ○ |
| 47 | 0.75 | 0.25 | 0 | x |
| 48 | 0.8 | 0.2 | 0 | x |
| 49 | 0.85 | 0.15 | 0 | x |

Figure 6:
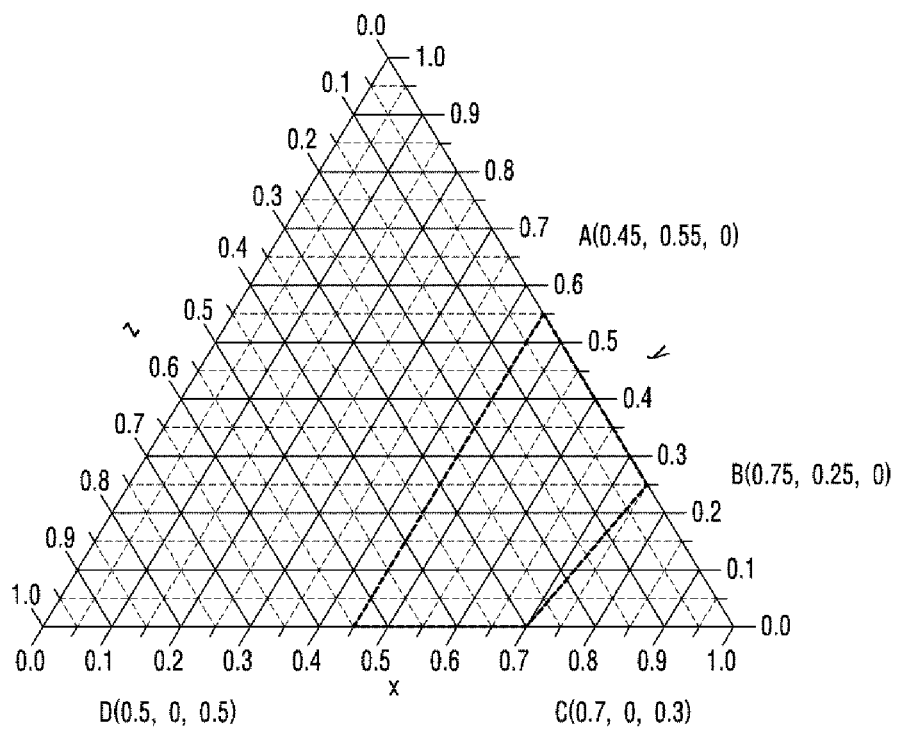
FIG. 6 is a triangular diagram representing an area by a solid line, which includes a case of a triclinic system beta (β) shown in FIG. 5.

FIG. 6 is a triangular diagram representing an area by a solid line, which includes a case of a triclinic system beta (β) shown in FIG. 5. As shown in FIG. 6, when x, i.e., the molar ratio of Ca, y, i.e., the molar ratio of Sr and z, i.e., the molar ratio of Eu are represented on coordinate axes of the triangular diagram, the coordinate values of x, y and z are located on the lines and at the inside of an area formed by connecting four points of A (0.45, 0.55, 0), B (0.75, 0.25, 0), C (0.7, 0, 0.3) and D (0.5, 0, 0.5) as vertices. As can be seen referring to Table 1 and FIG. 6, when the phosphor is located in such a range, it has particularly an excellent light emitting property. For example, the phosphor included in such a range has excellent internal quantum efficiency.

The phosphor located in the range shown in FIG. 6 has a predetermined crystal structure, i.e., the beta (β) crystal structure of the triclinic system while the phosphor located outside the range does not have.

An X-ray diffraction (XRD) analysis method may be used to identify the crystal structure. Through the XRD analysis, the analysis result of the crystal structure that the embodiment-based phosphor has, that is, the triclinic system beta (β) crystal structure is different from that of non-triclinic system beta (β) crystal structure, i.e., the triclinic system alpha (α) crystal structure.

Figure 7:
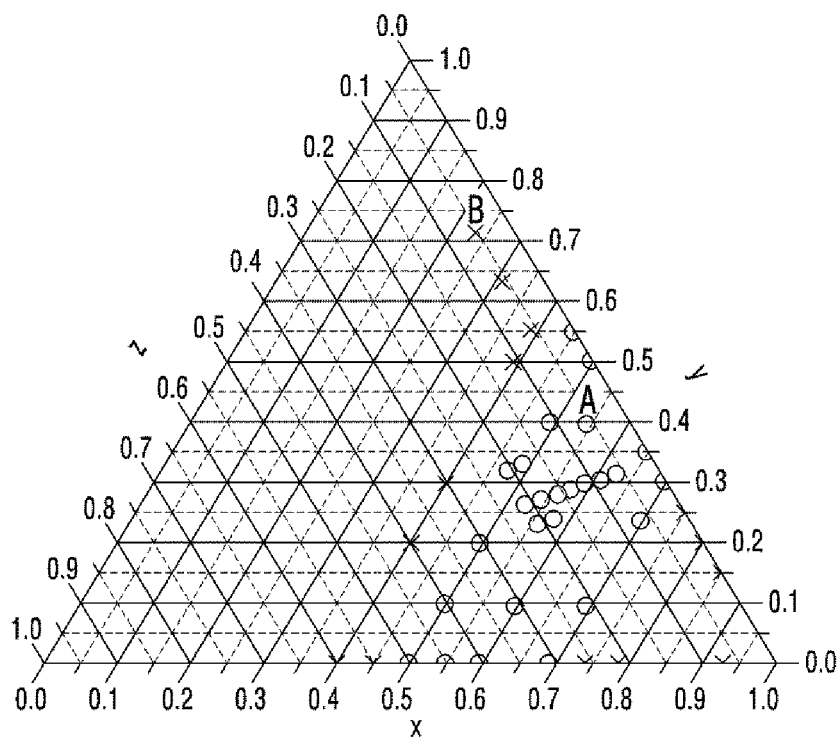
FIG. 7 is a triangular diagram representing a predetermined sample A included in a triclinic system beta (β) and a predetermined sample B included in a triclinic system alpha (α) in the triangular diagram having x, y and z coordinate axes.

FIG. 7 is a triangular diagram representing a predetermined sample A included in a triclinic system beta (β) and a predetermined sample B included in a triclinic system alpha (α) in the triangular diagram having x, y and z coordinate axes.

Figure 8:
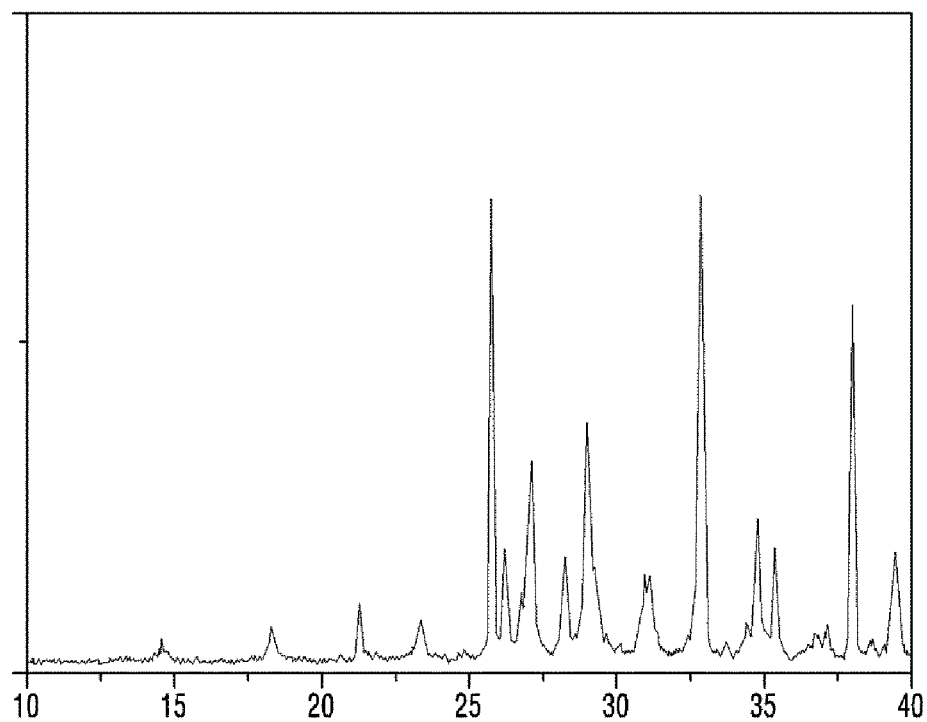
FIG. 8 is a graph showing a result of XRD analysis with respect to the sample A of FIG. 7.
Figure 9:
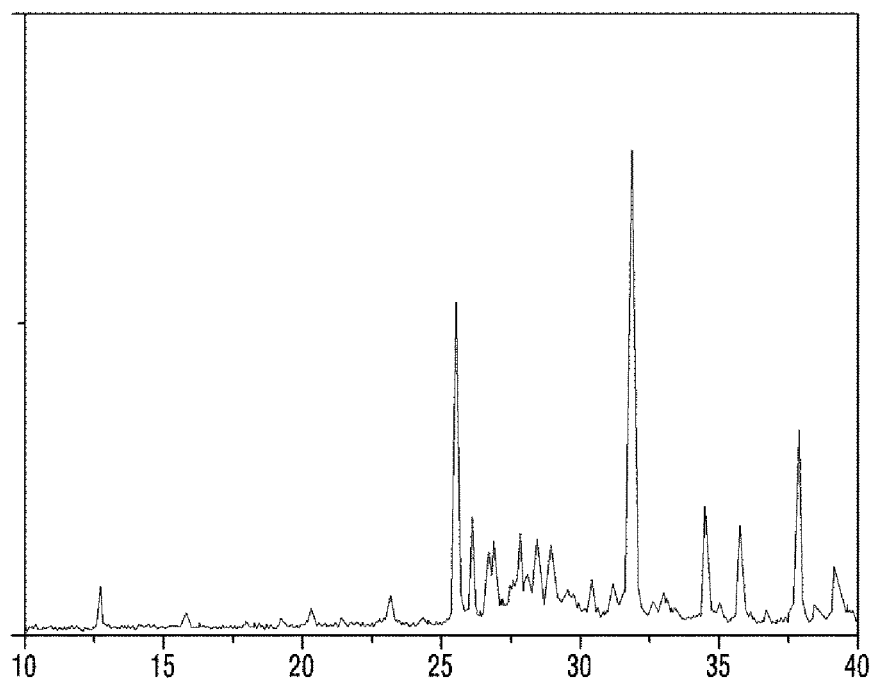
FIG. 9 is a graph showing a result of XRD analysis with respect to the sample B of FIG. 7.

FIG. 8 is a graph showing a result of XRD analysis with respect to the sample A of FIG. 7. FIG. 9 is a graph showing a result of XRD analysis with respect to the sample B of FIG. 7. As can be seen referring to the XRD analysis result of FIGS. 8 and 9, the beta (β) crystal structure of the triclinic system according to the embodiment has an analysis result different from that of non-beta (β) crystal structure of the triclinic system.

Within the same range in which the oxy-nitride based phosphor has the beta (β) crystal structure of the triclinic system, particularly when z, i.e., the molar ratio of Eu is from 0.15 to 0.4, the oxy-nitride based phosphor according to the embodiment emits light having a peak wavelength particularly close to the yellow wavelength band among the green wavelength band and the yellow wavelength band. That is, when the molar ratio z of Eu is from 0.15 to 0.4, the oxy-nitride based phosphor emits light having a peak wavelength particularly close to 560 nm among in the wavelength band of 500 nm to 600 nm.

Figure 10:
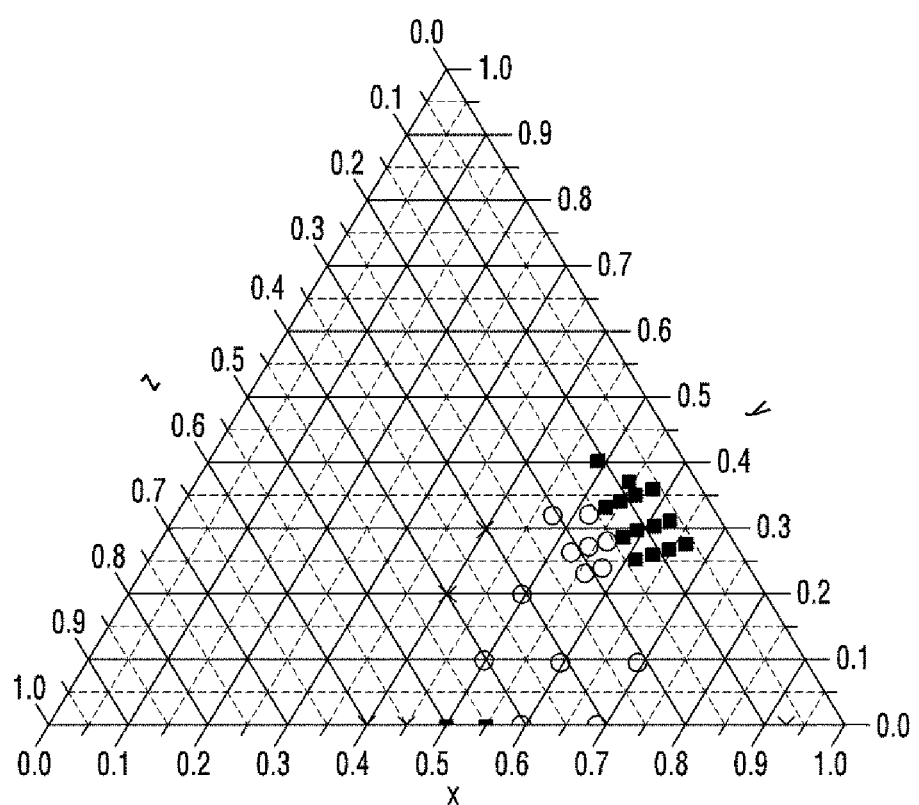
FIG. 10 is a triangular diagram obtained by plotting a case where light having a peak wavelength close to a yellow wavelength band is emitted.
Figure 11:
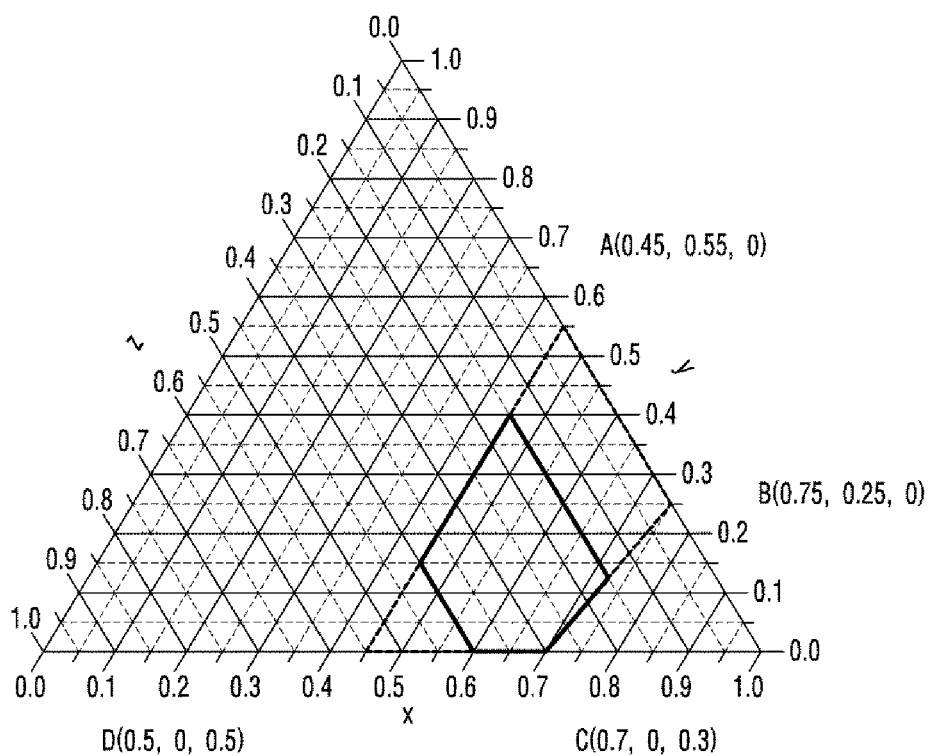
FIG. 11 is a triangular diagram representing by a solid line that light having a peak wavelength close to a yellow wavelength band is emitted.

Table 2 shows coordinate values of x, y and z when the phosphor has the triclinic system beta (β) crystal structure and a peak wavelength close to the yellow wavelength band through the experimental results of x, y and z, that is, the molar ratios of Ca, Sr and Eu by means of various values. FIG. 10 is a triangular diagram obtained by plotting a case where light having a peak wavelength close to a yellow wavelength band is emitted. In FIG. 10, circular plots mean that the light having a peak wavelength close to the yellow wavelength band is emitted. FIG. 11 is a view representing the x, y and z on the coordinate axes of the triangular diagram. FIG. 11 represents by a solid line the range of light having a peak wavelength close to a yellow wavelength band is emitted. In FIG. 11, the x, y and z, i.e., the molar ratios of Ca, Sr and Eu included in the embodiment-based phosphor emitting the light having a peak wavelength close to the yellow wavelength band are included on the lines and at the inside of the solid-line area.

TABLE 2

| No. | X | y | z |
|---|---|---|---|
| 1 | 0.58575 | 0.23925 | 0.175 |
| 2 | 0.568 | 0.232 | 0.2 |
| 3 | 0.5695 | 0.2805 | 0.15 |
| 4 | 0.55275 | 0.27225 | 0.175 |
| 5 | 0.536 | 0.264 | 0.2 |
| 6 | 0.527 | 0.323 | 0.15 |
| 7 | 0.48 | 0.32 | 0.2 |
| 8 | 0.7 | 0 | 0.3 |
| 9 | 0.6 | 0 | 0.4 |
| 10 | 0.7 | 0.1 | 0.2 |
| 11 | 0.6 | 0.1 | 0.3 |
| 12 | 0.5 | 0.2 | 0.3 |
| 13 | 0.5 | 0.1 | 0.4 |

Hereafter, a method for manufacturing the phosphor according to the embodiment will be described. The below-described method is only an example. It is not necessarily to depend on the following specific method to be described below. In order to manufacture the phosphor having a predetermined composition according to the embodiment and the phosphor having the crystal structure, it is possible to change a portion of the following manufacturing method.

Carbonate of alkali earths metal M, $SiO_2$, $Si_3N_4$ and $Eu_2O_3$ are mixed in a predetermined ratio until they are uniformly mixed, and thus a composite is prepared. The carbonate of the alkali earths metal M may include, for example, $SrCO_3$. Ca, Sr, Si, Eu metal, oxide, nitride, various salts and the like may be used as the material of the carbonate. All or a portion of the material may be mixed with liquid, for example, as a solution thereof. Also, $SrF_2$, BaF, $H_3BO_4$, NaCl and the like functioning as flux may be mixed together.

The composite is put into a boron nitride crucible, etc., and is fired in a reduction atmosphere or in an inert atmosphere, and thus a fired material is formed. An alumina crucible as well as the boron nitride crucible may be used. A firing temperature is from 1,400° C. to 1,700° C., and more preferably, from 1,450° C. to 1,600° C. Here, if the firing temperature is lower than 1,400° C., the various materials may not react with each other or the phosphor having the triclinic system crystal structure is not obtained. If the firing temperature is 1,700° C., the various materials are decomposed or molten themselves. When the firing temperature is from 1,450° C. to 1,600° C., a probability that the various materials do not react with each other or are decomposed can be reduced.

The reduction atmosphere may be one of a $H_2$—$N_2$ atmosphere, an ammonia atmosphere and a nitrogen-ammonia atmosphere. The inert atmosphere may be one of a nitrogen atmosphere and an argon atmosphere. In the inert atmosphere, $Eu^{3+}$ may be reduced into $Eu^{2+}$.

Regarding the firing process, some of the materials are mixed and fired first. Then, the other materials are mixed with the fired material obtained through the firing process and are fired. Consequently, an objective phosphor may be obtained.

The fired material obtained through the firing process may be pulverized and, for example, may be cleaned by water without impurities, e.g., distilled water which has pH less than 8, refined water and the like.

The following whole process will be taken as a concrete example of the manufacturing process. That is, first, $Sr_2SiO_4$:Eu is obtained by causing $SrCO_3$, $SiO_2$ and $Eu_2O_3$ to react with each other, and then the $Sr_2SiO_4$:Eu is pulverized. Subsequently, $SrSi_2O_2N_2$:Eu is obtained by causing the pulverized $Sr_2SiO_4$:Eu and $Si_3N_4$ to react with each other, and then $SrSi_2O_2N_2$:Eu is pulverized. Then, the pulverized $SrSi_2O_2N_2$:Eu is cleaned by distilled water or refined water which has pH less than 8 and impurities which have been removed as much as possible.

The following first to fourth embodiments show method for manufacturing the phosphor according to the embodiment by changing the molar ratio of strontium (Sr). Here, the ratio of strontium (Sr) means that, when the sum of x, y and z, that is, the ratios of Ca, Sr and Eu within the manufactured phosphor is 1, a proportion that the strontium (Sr) occupies in 1.

First Embodiment

A composite obtained by mixing 16.35 g of $SrCO_3$, 12.04 g of $SiO_2$, 34.25 g of $Si_3N_4$, 4.10 g of $Eu_2O_3$ and 33.26 g of $CaCO_3$ is put into a boron nitride crucible and then is fired in the reduction atmosphere using $H_2$—$N_2$ mixture gas at a temperature of about 1,500° C. for about 6 hours. The ratio of strontium included in the product, i.e., phosphor is 0.2375.

Second Embodiment

A composite obtained by mixing 21.43 g of $SrCO_3$, 11.83 g of $SiO_2$, 33.65 g of $Si_3N_4$, 4.03 g of $Eu_2O_3$ and 29.05 g of $CaCO_3$ is put into a boron nitride crucible and then is fired in the reduction atmosphere using $H_2$—$N_2$ mixture gas at a temperature of about 1,500° C. for about 6 hours. The ratio of strontium included in the product, i.e., phosphor is 0.3135.

Third Embodiment

A composite obtained by mixing 26.33 g of $SrCO_3$, 11.63 g of $SiO_2$, 33.08 g of $Si_3N_4$, 3.96 g of $Eu_2O_3$ and 24.99 g of $CaCO_3$ is put into a boron nitride crucible and then is fired in the reduction atmosphere using $H_2$—$N_2$ mixture gas at a temperature of about 1,500° C. for about 6 hours. The ratio of strontium included in the product, i.e., phosphor is 0.399.

Fourth Embodiment

A composite obtained by mixing 31.07 g of $SrCO_3$, 11.44 g of $SiO_2$, 32.53 g of $Si_3N_4$, 3.90 g of $Eu_2O_3$ and 21.06 g of $CaCO_3$ is put into a boron nitride crucible and then is fired in the reduction atmosphere using $H_2$—$N_2$ mixture gas at a temperature of about 1,500° C. for about 6 hours. The ratio of strontium included in the product, i.e., phosphor is 0.475.

The following first to fifth comparison examples are intended to be compared with the first to the fourth embodiment.

First Comparison Example

A composite obtained by mixing 10.44 g of $SiO_2$, 33.72 g of $Si_3N_4$, 3.94 g of $Eu_2O_3$ and 42.55 g of $CaCO_3$ is put into a boron nitride crucible and then is fired in the reduction atmosphere using $H_2$—$N_2$ mixture gas at a temperature of about 1,500° C. for about 6 hours. The ratio of strontium included in the product, i.e., phosphor is 0.

Second Comparison Example

A composite obtained by mixing 35.65 g of $SrCO_3$, 11.25 g of $SiO_2$, 32.00 g of $Si_3N_4$, 3.83 g of $Eu_2O_3$ and 17.26 g of $CaCO_3$ is put into a boron nitride crucible and then is fired in the reduction atmosphere using $H_2$—$N_2$ mixture gas at a temperature of about 1,500° C. for about 6 hours. The ratio of strontium included in the product, i.e., phosphor is 0.551.

Third Comparison Example

A composite obtained by mixing 40.09 g of $SrCO_3$, 11.07 g of $SiO_2$, 31.48 g of $Si_3N_4$, 3.77 g of $Eu_2O_3$ and 13.59 g of $CaCO_3$ is put into a boron nitride crucible and then is fired in the reduction atmosphere using $H_2$—$N_2$ mixture gas at a temperature of about 1,500° C. for about 6 hours. The ratio of strontium included in the product, i.e., phosphor is 0.627.

Fourth Comparison Example

A composite obtained by mixing 44.38 g of $SrCO_3$, 10.89 g of $SiO_2$, 30.98 g of $Si_3N_4$, 3.71 g of $Eu_2O_3$ and 10.03 g of $CaCO_3$ is put into a boron nitride crucible and then is fired in the reduction atmosphere using $H_2$—$N_2$ mixture gas at a temperature of about 1,500° C. for about 6 hours. The ratio of strontium included in the product, i.e., phosphor is 0.7125.

Fifth Comparison Example

A composite obtained by mixing 62.75 g of $SrCO_3$, 10.44 g of $SiO_2$, 33.72 g of $Si_3N_4$, and 3.94 g of $Eu_2O_3$ is put into a boron nitride crucible and then is fired in the reduction atmosphere using $H_2$—$N_2$ mixture gas at a temperature of about 1,500° C. for about 6 hours. The ratio of strontium included in the product, i.e., phosphor is 0.95.

Through the first to the fourth embodiments and the first to the fifth comparison examples, the total of nine phosphors can be manufactured.

Figure 12:
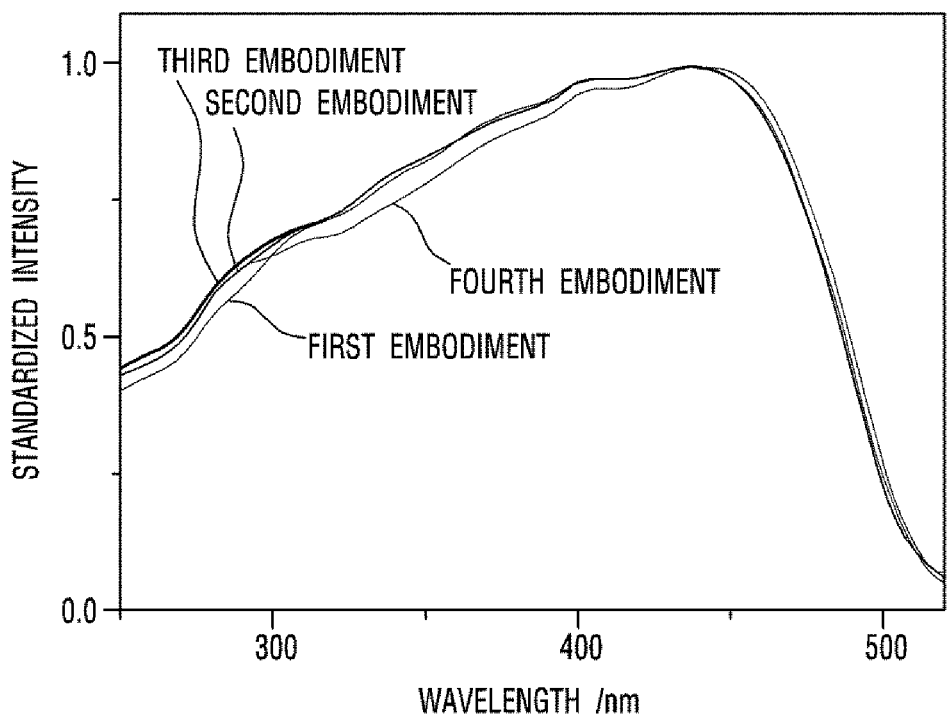
FIG. 12 shows excitation spectrums of phosphors respectively in accordance with a first to a fourth embodiments.
Figure 13:
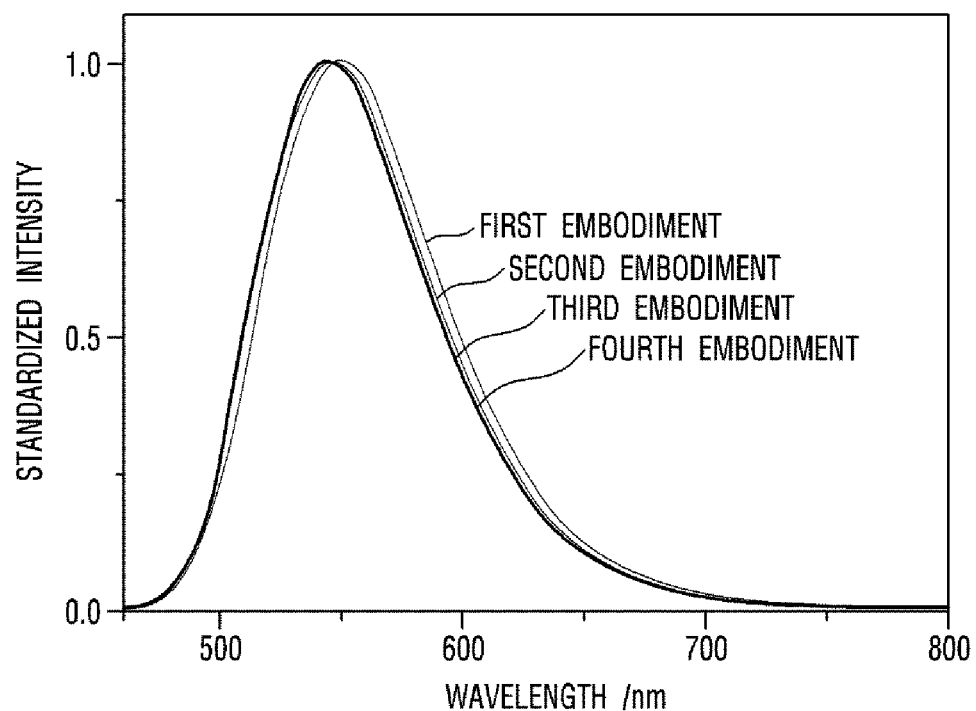
FIG. 13 shows light emission spectrums of phosphors respectively in accordance with the first to the fourth embodiments.

FIG. 12 shows excitation spectrums of phosphors respectively in accordance with the first to the fourth embodiments. FIG. 13 shows light emission spectrums of phosphors respectively in accordance with the first to the fourth embodiments.

The light emission spectrum of FIG. 13 is obtained when the phosphors according to the first to the fourth embodiments are excited by light having a wavelength of 460 nm. In FIGS. 12 and 13, the horizontal axis represents a wavelength (nm) and the vertical axis represents an intensity standardized to 1.

Referring to FIGS. 12 and 13, it can be seen that the phosphors according to the first to the fourth embodiments may be excited by ultraviolet ray and light in a blue visible light band close to an ultraviolet band and may emit light in a range from a green visible light band to a yellow visible light band.

Figure 14:
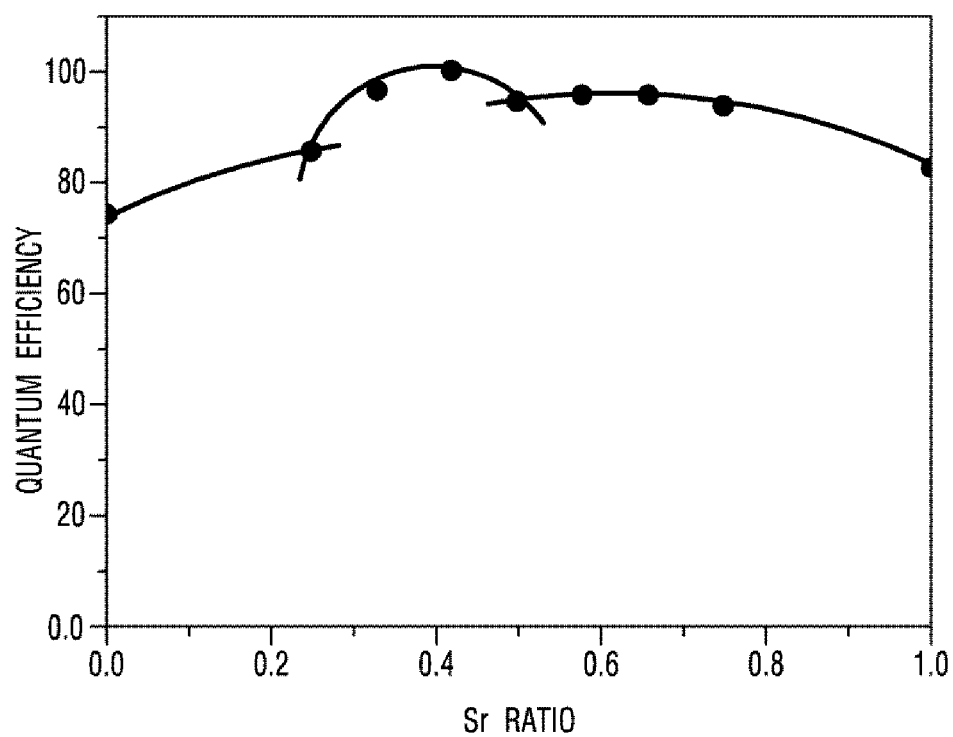
FIG. 14 is a graph showing quantum efficiencies based on strontium ratios of the first to the fourth embodiment and a first to a fifth comparison examples.

FIG. 14 is a graph showing internal quantum efficiencies based on strontium ratios of the first to the fourth embodiment and the first to the fifth comparison examples. The internal quantum efficiency means a ratio of emitted light to absorbed light.

The horizontal axis of FIG. 14 represents a ratio of strontium. The quantum efficiency of the vertical axis is relative based on the third embodiment. Referring to FIG. 14, it can be found that the quantum efficiency is high when the ratio of strontium is equal to or greater than 0.25 or is equal to or less than 0.55.

Figure 15:
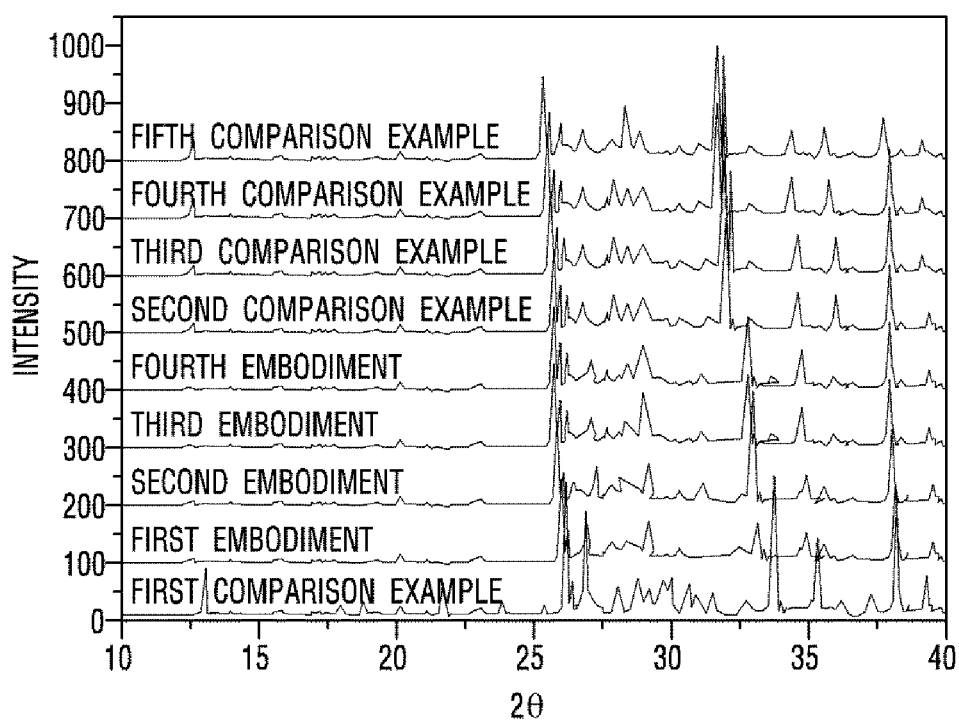
FIG. 15 is a graph showing X-ray diffraction patterns of the first to the fourth embodiment and the first to the fifth comparison examples.

FIG. 15 is a graph showing X-ray diffraction patterns of the first to the fourth embodiment and the first to the fifth comparison examples. In FIG. 15, x-axis represents the incident angle of X-ray and y-axis represents the intensity of diffraction. Here, X-ray is an electromagnetic wave having a wavelength of from 0.05 to 0.25 nm.

Referring to 2θ of the x-axis in FIG. 15, the crystal structures of the phosphors of the first to the fourth embodiments are the triclinic system beta (β) and thus, it can be appreciated that it is different from the triclinic system alpha (α), i.e., the crystal structures of the phosphors of the second to the fifth comparison examples.

Figure 16:
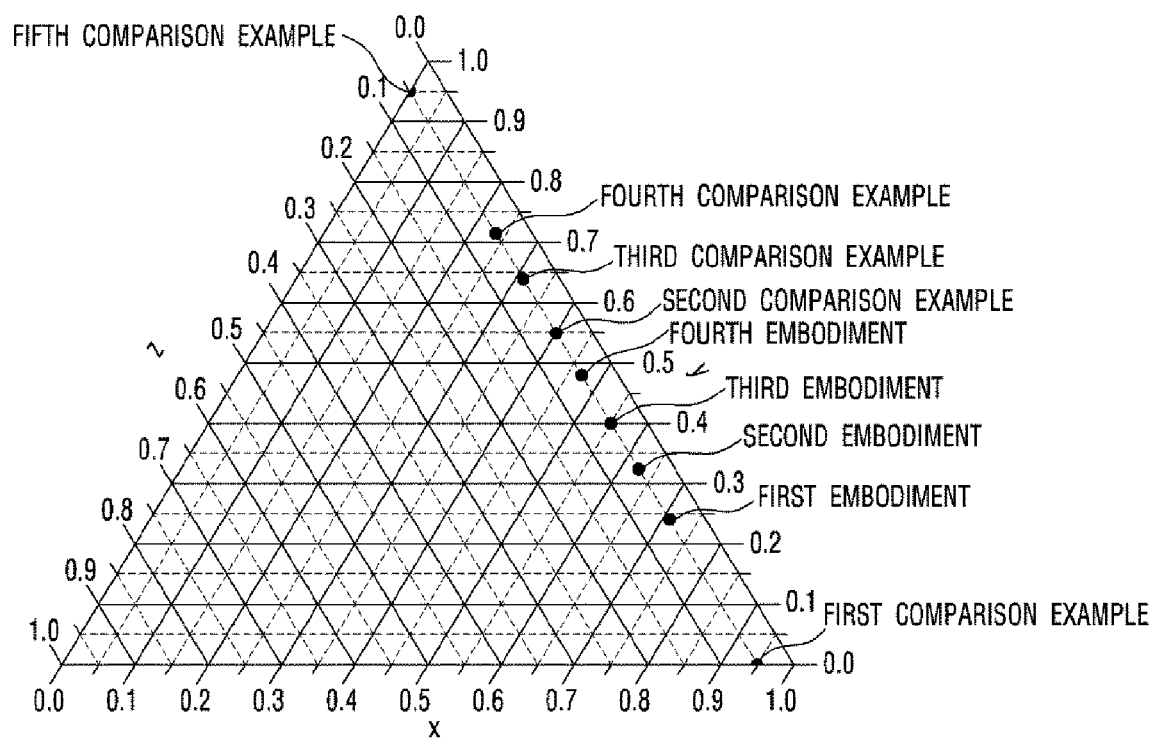
FIG. 16 shows results obtained by plotting the first to the fourth embodiment and the first to the fifth comparison examples on a triangular diagram representing x, y and z on coordinate axes thereof.

FIG. 16 shows results obtained by plotting the first to the fourth embodiment and the first to the fifth comparison examples on a triangular diagram representing x, y and z on coordinate axes thereof. It can be seen that the first to the fourth embodiments are included within the range of the phosphor according to the embodiment of the present invention.

Additionally, the following Table 3 shows the crystal structures and lattice constants of the first to the fourth embodiments and the first to the fifth comparison examples.

Through the lattice constant difference, it can be seen that the triclinic system beta (β) of the phosphors according to the first to the fourth embodiments is different from the triclinic system alpha (α) of the phosphors according to the second to the fifth comparison examples. The crystal structure of generally well-known $SrSi_2N_2O_2$ is triclinic system alpha (α). Therefore, it can be noted that the crystal structures of the phosphors according to the first to the fourth embodiments are different from that of $SrSi_2N_2O_2$.

Referring to Table 3, a unit cell volume of the triclinic system beta (β) crystal structure of the phosphors according to the first to the fourth embodiments is greater than 700 Å$^3$ In other words, the unit cell volume of the triclinic system beta (β) is more than twice as much as the unit cell volume of triclinic system alpha (α).

Also, the phosphors according to the first to the fourth embodiments have higher light emitting luminance than those of $CaSi_2N_2O_2$:Eu and $SrSi_2N_2O_2$:Eu.

<Light Emitting Device>

Figure 1:
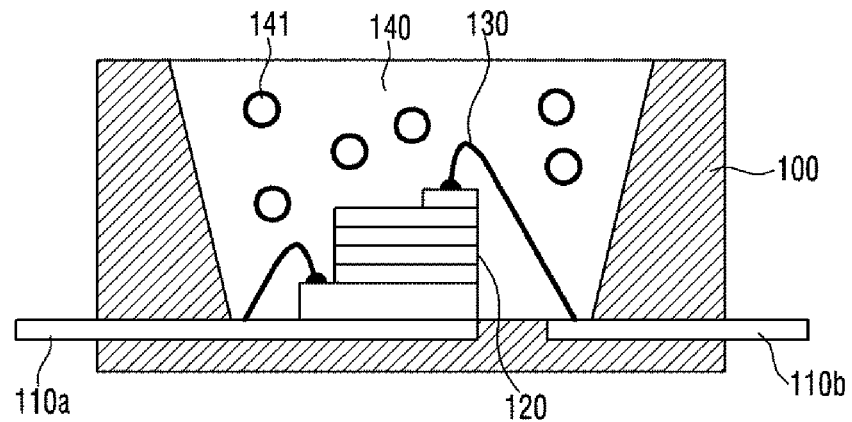
FIG. 1 is a cross sectional view of a light emitting device according to an embodiment.

FIG. 1 is a cross sectional view of a light emitting device according to the embodiment. FIG. 1 shows a surface mount-type light emitting device.

Referring to FIG. 1, the light emitting device according to the embodiment may include a body 100, a first and a second lead frames 110a and 110b, a light emitting element 120, a wire 130 and a light transmissive resin 140.

The first and the second lead frames 110a and 110b are disposed in the body 100. The body 100 has a recess receiving the light emitting element 120, the wire 130 and the light transmissive resin 140.

The first and the second lead frames 110a and 110b are apart from each other on the bottom of the recess of the body 100. The light emitting element 120 is disposed on the first lead frame 110a. The first lead frame 110a is electrically connected to one electrode of the light emitting element 120 through the wire 130. The second lead frame 110b is electrically connected to another electrode of the light emitting element 120 through the wire 130.

The light emitting element 120 is disposed in the recess of the body 100 and disposed on the first lead frame 110a. The light emitting element 120 generates light by means of voltage applied to the first and the second lead frames 110a and 110b.

TABLE 3

| | first comparison example | first embodiment | second embodiment | third embodiment | fourth embodiment | second comparison example | third comparison example | fourth comparison example | fifth comparison example |
|---|---|---|---|---|---|---|---|---|---|
| | | | | | crystal structure | | | | |
| lattice constant | monoclinic system | triclinic system beta (β) | triclinic system beta (β) | triclinic system beta (β) | triclinic system beta (β) | triclinic system beta (α) | triclinic system beta (α) | triclinic system beta (α) | triclinic system beta (α) |
| a(Å) | 7.3570 | 7.7138 | 7.7239 | 7.7654 | 7.7831 | 7.0430 | 7.0490 | 7.0644 | 7.0993 |
| b(Å) | 13.6442 | 27.5862 | 27.5432 | 27.8532 | 28.0758 | 7.1699 | 7.1786 | 7.2006 | 7.2493 |
| c(Å) | 10.4965 | 7.3291 | 7.3612 | 7.3725 | 7.3791 | 7.2251 | 7.2483 | 7.2544 | 7.2780 |
| α(°) | 90.0000 | 90.4873 | 90.5420 | 90.6617 | 90.7539 | 88.7002 | 88.7463 | 88.7024 | 88.7942 |
| β(°) | 101.8445 | 112.7451 | 112.8296 | 112.5600 | 112.3659 | 84.7876 | 88.7658 | 84.7388 | 84.8196 |
| ɣ(°) | 90.0000 | 89.6602 | 89.5397 | 90.8188 | 91.0972 | 75.9613 | 75.8454 | 75.7668 | 75.8919 |
| V(Å$^3$) | 1031.2000 | 1436.8335 | 1443.2599 | 1472.1919 | 1490.5238 | 352.4909 | 354.1673 | 356.1848 | 361.7778 |

Referring to FIGS. 14 and 15 and Table 3, it can be understood that when the ratio of strontium (Sr) is from 25% to 55%, the crystal structures of the phosphors according to the first to the fourth embodiments are triclinic system beta (β).

The light emitting element 120 may be a light emitting diode. Specifically, the light emitting element 120 may be a light emitting diode which is implemented by one of a horizontal type chip, a flip-chip and a vertical type chip.

When the voltage is applied to the light emitting element 120, the light emitting element 120 is able to emit light having a peak wavelength in 400 to 480 nm band. Here, the light emitting element 120 may be an InGaN light emitting diode chip which emits ultraviolet ray or light having a blue wavelength close to the ultraviolet ray.

The light emitting element 120 may be not only the light emitting diode but also a laser diode having a peak wavelength in the same wavelength band, a side light emitting laser diode, an inorganic electro field light emitting element and an organic electro field light emitting element.

The wire 130 is disposed in the recess of the body 100 and electrically connects the first and the second lead frames 110a and 110b to the light emitting element 120.

The light transmissive resin 140 is disposed in the recess of the body 100. The light transmissive resin 140 molds the light emitting element 120 and the wire 130. The light transmissive resin 140 transmits the light emitted from the light emitting element 120. The light transmissive resin 140 may be an epoxy resin, a silicone resin, a polyimide resin, a urea resin and an acrylic resin.

As shown in the drawing, the light transmissive resin 140 may mold around the entire light emitting element 120 or may mold partially a predetermined light emitting portion of the light emitting element 120 if necessary. For example, when the light emitting element 120 is a low power light emitting element, it is preferable to mold the entire light emitting element 120. When the light emitting element 120 is a high power light emitting element, it is preferable to mold partially the light emitting element 120 for the purpose of the uniform distribution of phosphors 141.

The light transmissive resin 140 includes the phosphor 141 according to the embodiment. The phosphor 141 is excited by a part of light emitted from the light emitting element 120 and emits light having a wavelength different from that of the light emitted from the light emitting element 120. The phosphor 141 may be a single phosphor or may include various phosphors. For instance, the phosphor 141 may include at least one of yellow, green and red phosphors. The yellow phosphor emits light having a dominant wavelength in a wavelength band from 540 nm to 585 nm in response to blue light (430 nm to 480 nm). The green phosphor emits light having a dominant wavelength in a wavelength band from 510 nm to 535 nm in response to the blue light (430 nm to 480 nm). The red phosphor emits light having a dominant wavelength in a wavelength band from 600 nm to 650 nm in response to the blue light (430 nm to 480 nm). The yellow phosphor may be a silicate phosphor or a YAG-based phosphor. The green phosphor may be the silicate phosphor, a nitride phosphor or a sulfide phosphor. The red phosphor may be the nitride phosphor or the sulfide phosphor.

Figure 2:
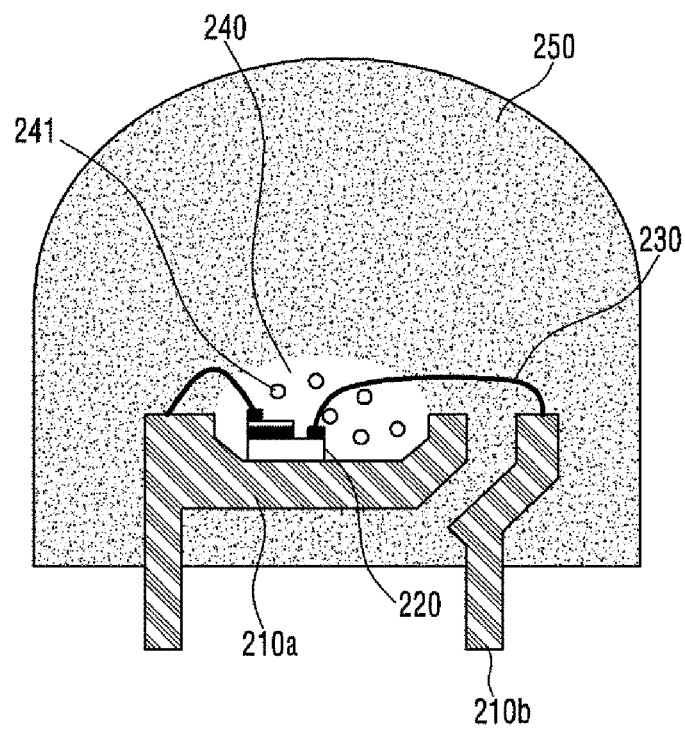
FIG. 2 is a cross sectional view of a light emitting device according to another embodiment.

FIG. 2 is a cross sectional view of a light emitting device according to another embodiment. The light emitting device shown in FIG. 2 is formed in the form of a vertical lamp type.

The light emitting device shown in FIG. 2 may include a first and the second lead frames 210a and 210b, a light emitting element 220, a wire 230, a light transmissive resin 240 and an external material 250.

The first and the second lead frames 210a and 210b are disposed apart from each other. The light emitting element 220 is disposed on the first lead frame 210a. The first lead frame 210a is electrically connected to one electrode of the light emitting element 220 through the wire 230. The second lead frame 210b is electrically connected to another electrode of the light emitting element 220 through the wire 230.

The light emitting element 220 is disposed on the first lead frame 210a. The light emitting element 220 generates light by means of voltage applied to the first and the second lead frames 210a and 210b.

The light emitting element 220 may be a light emitting diode. Specifically, the light emitting element 220 may be a light emitting diode which is implemented by one of a horizontal type chip, a flip-chip and a vertical type chip.

When the voltage is applied to the light emitting element 220, the light emitting element 220 is able to emit light having a peak wavelength in 400 to 480 nm band. The light emitting element 220 may be an InGaN light emitting diode chip which emits ultraviolet ray and light having a blue wavelength close to the ultraviolet ray.

The light emitting element 220 may be not only the light emitting diode but also a laser diode having a peak wavelength in the same wavelength band, a side light emitting laser diode, an inorganic electro field light emitting element and an organic electro field light emitting element.

The wire 230 electrically connects the first and the second lead frames 210a and 210b to the light emitting element 220.

The light transmissive resin 240 is disposed on the first lead frame 210a and molds the light emitting element 220. The light transmissive resin 240 also molds a portion of the wire 230 connected to the light emitting element 220. The light transmissive resin 240 transmits the light emitted from the light emitting element 220. The light transmissive resin 240 may be an epoxy resin, a silicone resin, a polyimide resin, a urea resin and an acrylic resin.

The light transmissive resin 240 may mold around the entire light emitting element 220 or may mold partially a predetermined light emitting portion of the light emitting element 220 if necessary.

The light transmissive resin 240 includes a phosphor 241 according to the embodiment. The phosphor 241 is excited by a part of light emitted from the light emitting element 220 and emits light having a wavelength different from that of the light emitted from the light emitting element 220. The phosphor 241 may be a single phosphor or may include various phosphors. For instance, the phosphor 241 may include at least one of yellow, green and red phosphors. The yellow phosphor emits light having a dominant wavelength in a wavelength band from 540 nm to 585 nm in response to blue light (430 nm to 480 nm). The green phosphor emits light having a dominant wavelength in a wavelength band from 510 nm to 535 nm in response to the blue light (430 nm to 480 nm). The red phosphor emits light having a dominant wavelength in a wavelength band from 600 nm to 650 nm in response to the blue light (430 nm to 480 nm). The yellow phosphor may be a silicate phosphor or a YAG-based phosphor. The green phosphor may be the silicate phosphor, a nitride phosphor or a sulfide phosphor. The red phosphor may be the nitride phosphor or the sulfide phosphor.

The external material 250 molds a portion of the first and the second lead frames 210a and 210b and the entire light emitting element 220, the entire wire 230 and the entire light transmissive resin 240. Therefore, the portions other than the molded portion of the first and the second lead frames 210a and 210b are exposed to the outside of the external material 250.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A phosphor which emits light having a peak wavelength between a green wavelength band and a yellow wavelength band, has a crystal structure of which the chemical formula is $MSi_2N_2O_2$, $M=Ca_xSr_yEu_z$ ($x+y+z=1$), and has a triclinic system crystal structure in which, when molar ratios of Ca, Sr and Eu are x, y and z respectively, $x+y+z=1$ and when the x, y and z are represented by a triangular projection, the x, y and z are distributed on the lines and at the inside of an area formed by connecting five points of (0.45, 0.55, 0), (0.75, 0.25, 0), (0.75, 0, 0.25), (0.5, 0, 0.5) and (0.45, 0.05, 0.5) by a solid line on a triangular diagram.

2. The phosphor of claim 1, wherein, when x, i.e., the molar ratio of Ca, y, i.e., the molar ratio of Sr and z, i.e., the molar ratio of Eu are represented on a triangular diagram (x, y, z), the x, y and z are located on the lines and at the inside of an area formed by connecting points of A (0.45, 0.55, 0), B (0.75, 0.25, 0), C (0.7, 0, 0.3) and D (0.5, 0, 0.5) as vertices.

3. The phosphor of claim 1, wherein, when x, i.e., the molar ratio of Ca, y, i.e., the molar ratio of Sr and z, i.e., the molar ratio of Eu are represented on a triangular diagram (x, y, z), the x, y and z are located on the lines and at the inside of an area formed by connecting points of A (0.45, 0.4, 0.15), B (0.75, 0.1, 0.15), C (00.75, 0, 0.25), D (0.6, 0, 0.4) and E (0.45, 0.15, 0.4) as vertices.

4. The phosphor of claim 1, wherein the molar ratio z of Eu is within a range from 0.15 to 0.4 ($0.15 \leq z \leq 0.4$).

5. The phosphor of claim 1, wherein the molar ratio y of Sr is within a range from 0.2375 to 0.475 ($0.2375 \leq y \leq 0.475$).

6. The phosphor of claim 1, wherein the molar ratio y of Sr is within a range from 0.25 to 0.55 ($0.25 \leq y \leq 0.55$).

7. The phosphor of claim 1, wherein the peak wavelength is from 540 nm to 585 nm.

8. The phosphor of claim 1, wherein a unit cell volume of the triclinic system crystal structure is greater than 700 $Å^3$.

9. The phosphor of claim 1, wherein the phosphor comprises a beta (β) crystal structure of the triclinic system.

10. A phosphor which emits light having a peak wavelength between a green wavelength band and a yellow wavelength band, has a crystal structure of which the chemical formula is $MSi_2N_2O_2$, $M=Ca_xSr_yEu_z$ ($x+y+z=1$), and has a triclinic system crystal structure in which, when molar ratios of Ca, Sr and Eu are x, y and z respectively, $x+y+z=1$ and when the x, y and z are represented by a triangular projection, the x, y and z are distributed on the lines and at the inside of an area formed by connecting five points of (0.45, 0.4, 0.15), (0.75, 0.1, 0.15), (0.75, 0, 0.25), (0.6, 0, 0.4) and (0.45, 0.15, 0.4) by a solid line on a triangular diagram,
wherein a unit cell volume of the triclinic system crystal structure is greater than 700 $Å^3$.

11. The phosphor of claim 10, wherein the molar ratio z of the Eu is within a range from 0.15 to 0.4 ($0.15 \leq z \leq 0.4$).

12. The phosphor of claim 10, wherein the molar ratio y of the Sr is within a range from 0.2375 to 0.475 ($0.2375 \leq y \leq 0.475$).

13. The phosphor of claim 10, wherein the molar ratio y of the Sr is within a range from 0.25 to 0.55 ($0.25 \leq y \leq 0.55$).

14. The phosphor of claim 10, wherein the peak wavelength is from 540 nm to 585 nm.

15. The phosphor of claim 10, wherein the phosphor comprises a beta (β) crystal structure of the triclinic system.

16. A light emitting device comprising:
a light emitting element; and
a phosphor which is excited by a part of light emitted from the light emitting element and emits light having a wavelength different from that of the light emitted from the light emitting element,
wherein the phosphor emits light having a peak wavelength between a green wavelength band and a yellow wavelength band, has a crystal structure of which the chemical formula is $MSi_2N_2O_2$, $M=Ca_xSr_yEu_z$ ($x+y+z=1$), and has a triclinic system crystal structure in which, when molar ratios of Ca, Sr and Eu are x, y and z respectively, $x+y+z=1$ and when the x, y and z are represented by a triangular projection, the x, y and z are distributed on the lines and at the inside of an area formed by connecting five points of (0.45, 0.55, 0), (0.75, 0.25, 0), (0.75, 0, 0.25), (0.5, 0, 0.5) and (0.45, 0.05, 0.5) by a solid line on a triangular diagram.

17. The light emitting device of claim 16, wherein the molar ratio z of Eu is within a range from 0.15 to 0.4 ($0.15 \leq z \leq 0.4$).

18. The light emitting device of claim 16, wherein the molar ratio y of the Sr is within a range from 0.2375 to 0.475 ($0.2375 \leq y \leq 0.475$).

19. The light emitting device of claim 16, wherein the molar ratio y of the Sr is within a range from 0.25 to 0.55 ($0.25 \leq y \leq 0.55$).

20. The light emitting device of claim 16, wherein the peak wavelength is from 540 nm to 585 nm.

* * * * *